US008842421B2

(12) United States Patent
Gingrich

(10) Patent No.: US 8,842,421 B2
(45) Date of Patent: Sep. 23, 2014

(54) ARC-RESISTANT SWITCHGEAR ENCLOSURE WITH LATCH FOR VENT FLAP

(71) Applicant: Central Electric Manufacturing Company, Fulton, MO (US)

(72) Inventor: Paul W. Gingrich, Fulton, MO (US)

(73) Assignee: Central Electric Manufacturing Company, Fulton, MO (US)

( * ) Notice: Subject to any disclaimer, the term of this patent is extended or adjusted under 35 U.S.C. 154(b) by 211 days.

(21) Appl. No.: 13/657,393

(22) Filed: Oct. 22, 2012

(65) Prior Publication Data

US 2014/0110232 A1    Apr. 24, 2014

(51) Int. Cl.
| | |
|---|---|
| *H01H 33/53* | (2006.01) |
| *H02B 1/56* | (2006.01) |
| *H05K 7/20* | (2006.01) |
| *H01H 33/02* | (2006.01) |
| *H05K 5/00* | (2006.01) |

(52) U.S. Cl.
CPC .. *H02B 1/56* (2013.01); *H05K 5/00* (2013.01); *H01H 33/53* (2013.01)
USPC ........... 361/676; 361/605; 361/616; 361/678; 312/222; 312/223.1; 312/216; 312/296; 218/155; 218/157; 174/50; 174/17 VA; 174/520; 200/306

(58) Field of Classification Search
CPC ....... H01H 33/53; H01H 33/02; H01H 9/342; H02B 13/025; H02B 1/56; H05K 7/20; H05K 5/00; H01R 13/53; E05C 9/10
USPC ......... 361/600, 601, 605, 608, 611, 614, 618, 361/622, 624, 627, 634, 636, 641, 652, 673, 361/676, 678, 690–692; 218/34, 35, 149, 218/151, 155–158; 312/213, 216, 222, 312/223.1, 265.5, 165.6, 296, 236; 200/50.1, 50.3, 50.17, 50.21, 50.23, 200/50.32, 306–308, 389, 400; 174/17 R, 174/17 VA, 50, 58, 68.1, 68.2, 520; 454/184; 29/604, 602.1, 606, 607
See application file for complete search history.

(56) References Cited

U.S. PATENT DOCUMENTS

| | | | | |
|---|---|---|---|---|
| 4,864,466 | A * | 9/1989 | Gasparetto | 361/605 |
| 5,574,624 | A * | 11/1996 | Rennie et al. | 361/676 |
| 5,710,402 | A * | 1/1998 | Karnbach et al. | 218/157 |
| 5,767,440 | A * | 6/1998 | Byron et al. | 174/17 VA |
| 5,878,905 | A * | 3/1999 | Gronbach et al. | 220/203.01 |
| 5,905,244 | A * | 5/1999 | Smith et al. | 218/155 |
| 6,301,108 | B1 | 10/2001 | Stockbridge | |

(Continued)

FOREIGN PATENT DOCUMENTS

JP    3040701    7/1989

*Primary Examiner* — Michail V Datskovskiy
(74) *Attorney, Agent, or Firm* — Geoffrey A. Mantooth

(57) ABSTRACT

An arc-resistant switchgear enclosure has a vent opening and a vent flap. Normally the vent flap is open to allow air to circulate through the enclosure. However, in the event of an arc fault explosion in the enclosure, the vent flap is forced to close by the explosion. As the vent flap closes, a flexible latch member moves along a keeper and prevents the vent flap from reopening. In some embodiments, the latch member contacts the keeper and props the vent flap open for normal operation.

13 Claims, 8 Drawing Sheets

(56) References Cited

U.S. PATENT DOCUMENTS

| | | |
|---|---|---|
| 6,404,629 B1 | 6/2002 | Austin et al. |
| 6,407,331 B1 * | 6/2002 | Smith et al. .................... 174/50 |
| 6,561,604 B2 * | 5/2003 | Leccia et al. ................. 312/326 |
| 7,095,606 B2 | 8/2006 | Mahn et al. |
| 7,710,720 B2 | 5/2010 | Fuke et al. |
| 7,952,857 B1 * | 5/2011 | Motley et al. ................. 361/678 |
| 8,419,141 B2 * | 4/2013 | Niedzwiecki ................. 312/216 |
| 8,733,855 B2 * | 5/2014 | Josten et al. ............... 312/223.1 |
| 2002/0117901 A1 | 8/2002 | Spivey et al. |
| 2012/0028559 A1 | 2/2012 | Kingston |
| 2012/0097413 A1 * | 4/2012 | Bugaris et al. ................. 174/50 |
| 2013/0143478 A1 * | 6/2013 | Arcos et al. ................... 454/184 |

* cited by examiner

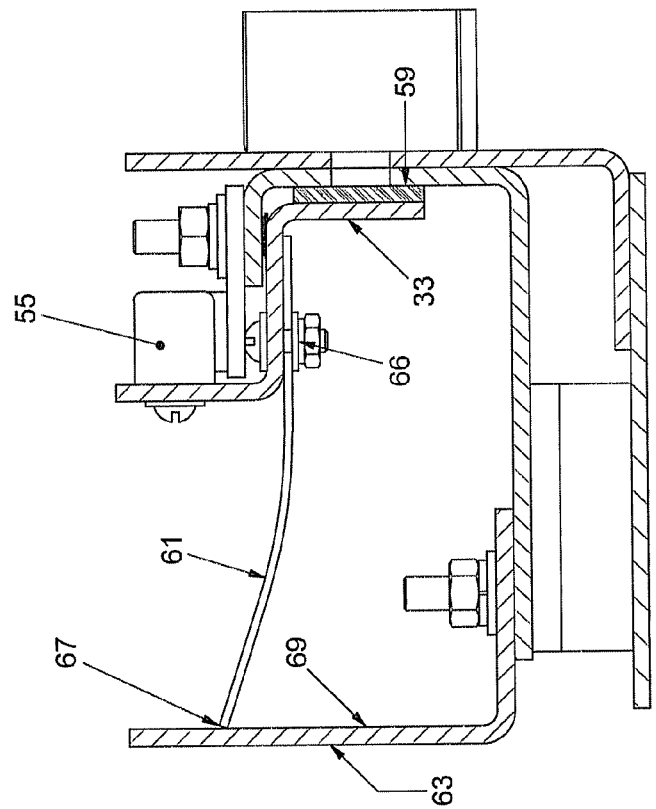
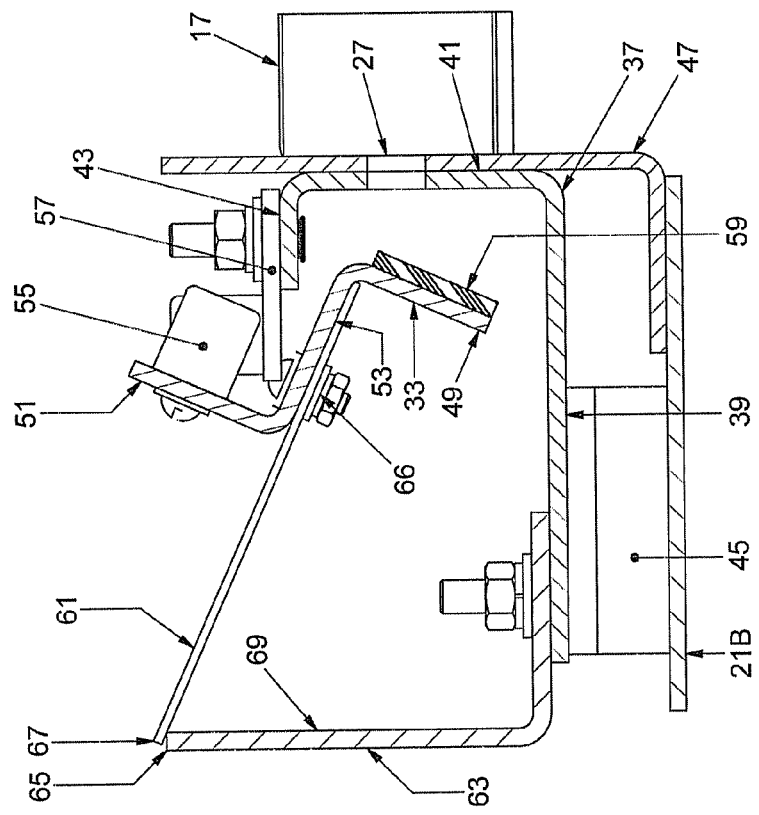
Fig. 5
Fig. 4

ARC-RESISTANT SWITCHGEAR ENCLOSURE WITH LATCH FOR VENT FLAP

FIELD OF THE INVENTION

The present invention relates to arc-resistant switchgear enclosures and in particular to vent flaps and latches therefor.

BACKGROUND OF THE INVENTION

Arc-resistant switchgear enclosures house medium voltage electrical switchgear components such as potential transformers (PT), fuses, circuit breakers, etc. A typical enclosure has plural compartments, with each compartment housing one or more electrical components. Medium voltage generally is in the 5-38 KVA range.

During normal operation, the switchgear components generate heat and require air circulation for cooling. The enclosure has vents to provide cooling. For example, an intake or inlet vent may be on or near a front access door. Air is drawn in through the inlet vent, is heated by the switchgear components, rises and exits through vents in the top of the enclosure, into a plenum.

However, such medium voltage electrical components can experience arc faults. An arc fault creates an explosion of hot gasses which can endanger nearby personnel and equipment.

In order to protect nearby personnel and equipment, enclosures are metal clad and are designed to contain the explosion and vent the explosive gasses in a controlled manner. Personnel and equipment at the front, sides and rear of an enclosure are protected by the walls of the enclosure. The explosive gasses are typically vented up into a plenum which channels the explosive gasses to a safe area, such as a building exterior.

When an arc fault explosion initiates, the intake vents, which are typically on or below the doors, must be closed to prevent the escape of hot gasses. Thus, the challenge lies in designing a vent that is open during normal operation to allow for ventilation and cooling of the enclosure components, but which suddenly closes, and remains closed, during an arc fault explosion in the compartment.

SUMMARY OF THE INVENTION

An arc-resistant switchgear enclosure comprises wall defining an interior compartment. The wall has a vent that communicates with the compartment. A vent flap is movable between open and closed positions, with the closed position being where the vent flap closes the vent, with the open position being where the vent is open. A latching arrangement comprises a latch member and a keeper. The latch member is mounted to one of the enclosure wall or the vent flap, with the keeper mounted to the other of the enclosure wall or the vent flap. The latch member is more flexible than the keeper. The latch member has a free end and the keeper has a surface. The latch member free end engages the keeper surface when the vent flap is in the closed position, thereby preventing the vent flap from opening.

In accordance with another aspect of the arc-resistant switchgear enclosure, the latch member comprises a leaf.

In accordance with still another aspect of the arc-resistant switchgear enclosure, the latch member flexes when the vent flap is in the closed position and the latch member free end engages the keeper.

In accordance with another aspect of the arc-resistant switchgear enclosure, the keeper is "L" shaped.

In accordance with another aspect of the arc-resistant switchgear enclosure, the latch member bears on the keeper when the vent flap is in the open position so as to prop open the vent flap.

In accordance with still another aspect of the arc-resistant switchgear enclosure, the latch member comprises a leaf, the latch member flexes when the vent flap is in the closed position and the latch member free end engages the keeper, the keeper is "L" shaped, and the latch member bears on the keeper when the vent flap is in the open position so as to prop open the vent flap.

In accordance with another aspect of the arc-resistant switchgear enclosure, the vent flap is mounted to the enclosure wall by at least one hinge along a side of the vent flap. The latch member is located on an opposite side of the vent flap.

In accordance with another aspect of the arc-resistant switchgear enclosure, the latch member is a first latch member and the keeper is a first keeper. There further comprises a second latch member and a second keeper, with the second latch member mounted to the other end of the vent flap.

In accordance with another aspect of the arc-resistant switchgear enclosure, the vent flap is shaped like an angular "S" in transverse cross-section.

In accordance with another aspect of the arc-resistant switchgear enclosure, a prop supports the vent flap in the open position.

There is also provided a method of closing a vent in a switchgear enclosure during an arc fault explosion inside of the enclosure. A vent flap is provided in an open position relative to the vent to allow air to pass through the vent. The vent flap is propped in the open position. The arc fault explosion is allowed to move the vent flap to close the vent. As the vent closes, moving a latch member along a surface of a keeper, the latch member becoming bowed. After the vent flap closes, preventing the reopening of the vent flap by the latch member acting on the keeper.

In accordance with another aspect of the method, the step of moving a latch member along a surface of a keeper further comprises sliding a free end of the latch member along the keeper surface.

In accordance with another aspect of the method, the step of propping the vent flap in the open position further comprises contacting the latch member on the keeper.

BRIEF DESCRIPTION OF THE DRAWINGS

FIG. 4 is a cross-sectional view of the vent flap, shown in the open position, taken along lines IV-IV of FIG. 3.

FIG. 5 shows the vent flap of FIG. 4 in the closed position.

DESCRIPTION OF THE PREFERRED EMBODIMENTS

Figure 1:
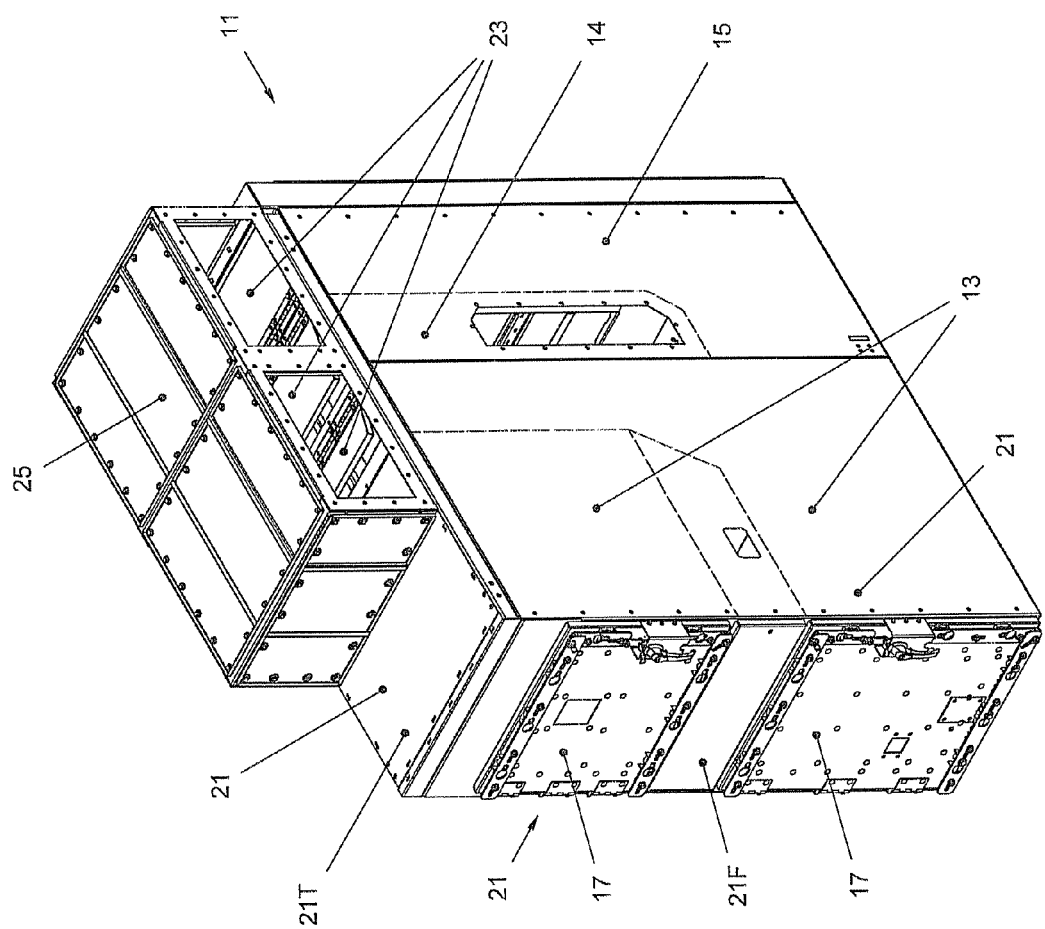
FIG. 1 is a perspective view of an arc-resistant switchgear enclosure.

In FIG. 1, there is shown an arc-resistant switchgear enclosure 11 with plural compartments 13, 14, 15. There are two front compartments 13 (shown generally by dashed lines), with each compartment accessible by a respective door 17. The front compartments 13 may have different dimensions, wherein the front doors 17 will likewise have different dimensions. There is also a middle compartment 14 and a rear compartment 15. The compartments 13, 14, 15, are used to house switchgear components such as potential transformers, fuses, circuit breakers, bus bars, etc. In the description herein, like reference numbers among the figures designate like components.

While the switchgear is in service, the doors 17 are normally closed and latched. If access to a compartment is required, the respective door 17 is opened to reveal a door opening 19 in the enclosure 11.

The enclosure has walls 21 that enclose the compartments 13, 14, 15 and that are capable of containing and directing an arc fault explosion therein. In the preferred embodiment, the walls are metal clad. In the case of a rectangularly shaped enclosure, there is a front wall 21F, side walls, a top wall 21T (see FIG. 1), a bottom wall 21B (see FIG. 4) and a rear wall. The walls of the enclosure may be referred to herein as a single wall. The enclosure has vents to allow for air to be drawn in for cooling. The heated air then escapes.

One or more outlet vents 23 are located in the top wall 21T of the enclosure. A plenum 25 is located above the enclosure and the outlet vents 23. The compartment or compartments 13, 14, 15 communicate with the outlet vents 23 and the plenum 25.

Figure 2:
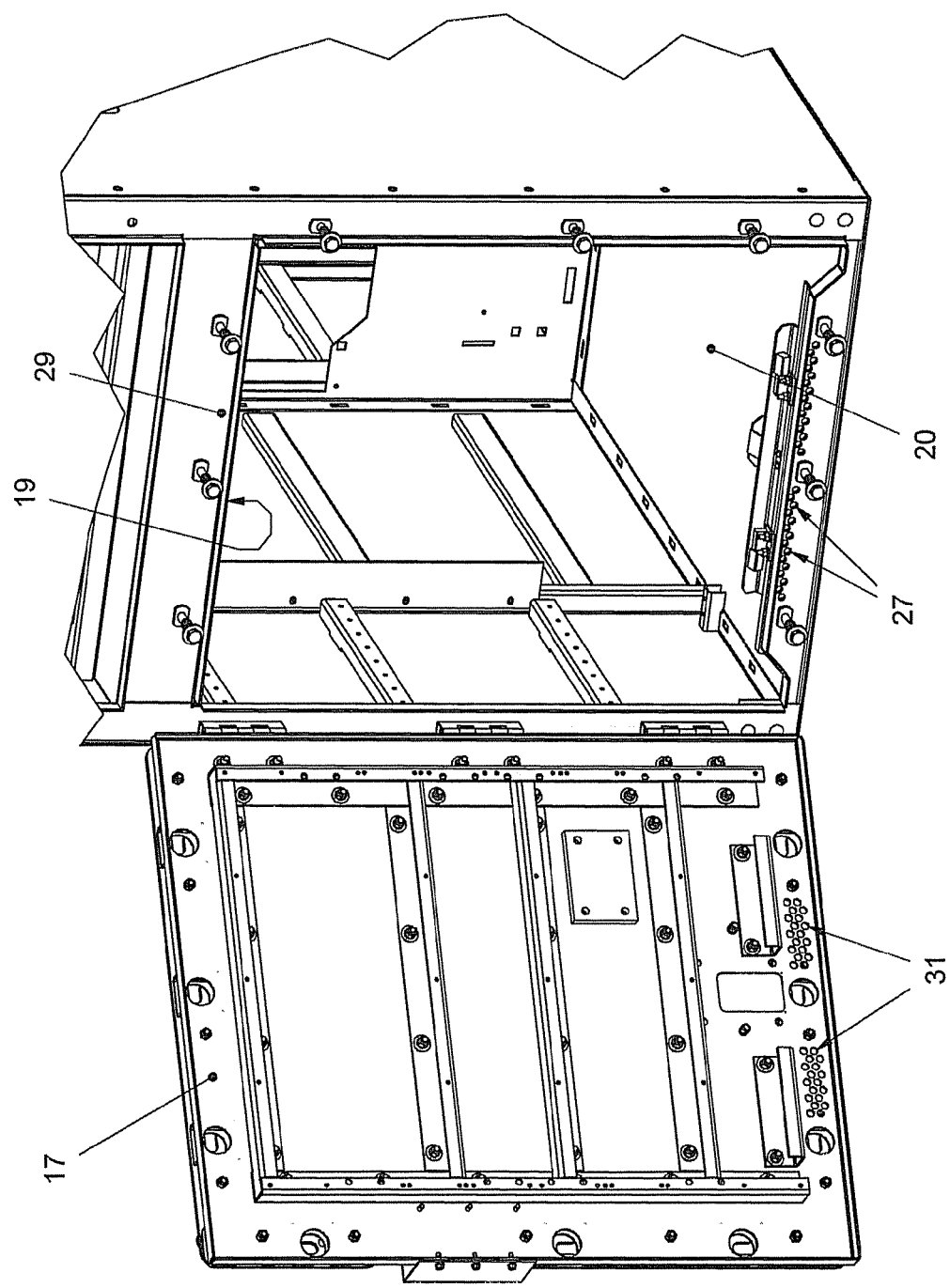
FIG. 2 is a perspective view showing a compartment inside of the enclosure with the door open.

The enclosure has one or more inlet vents 27. Referring to FIG. 2, in the preferred embodiment, one of the compartments 13 has an inlet vent 27 below the door opening, in the front wall 21F. The inlet vent 27 comprises plural openings and is located below, or outside, the door gasket 29. The door, if covering the vent openings, is also provided with corresponding vent openings 31. Thus, when the door 17 is closed, air is drawn through openings 31, 27 into the compartment.

Figure 3:
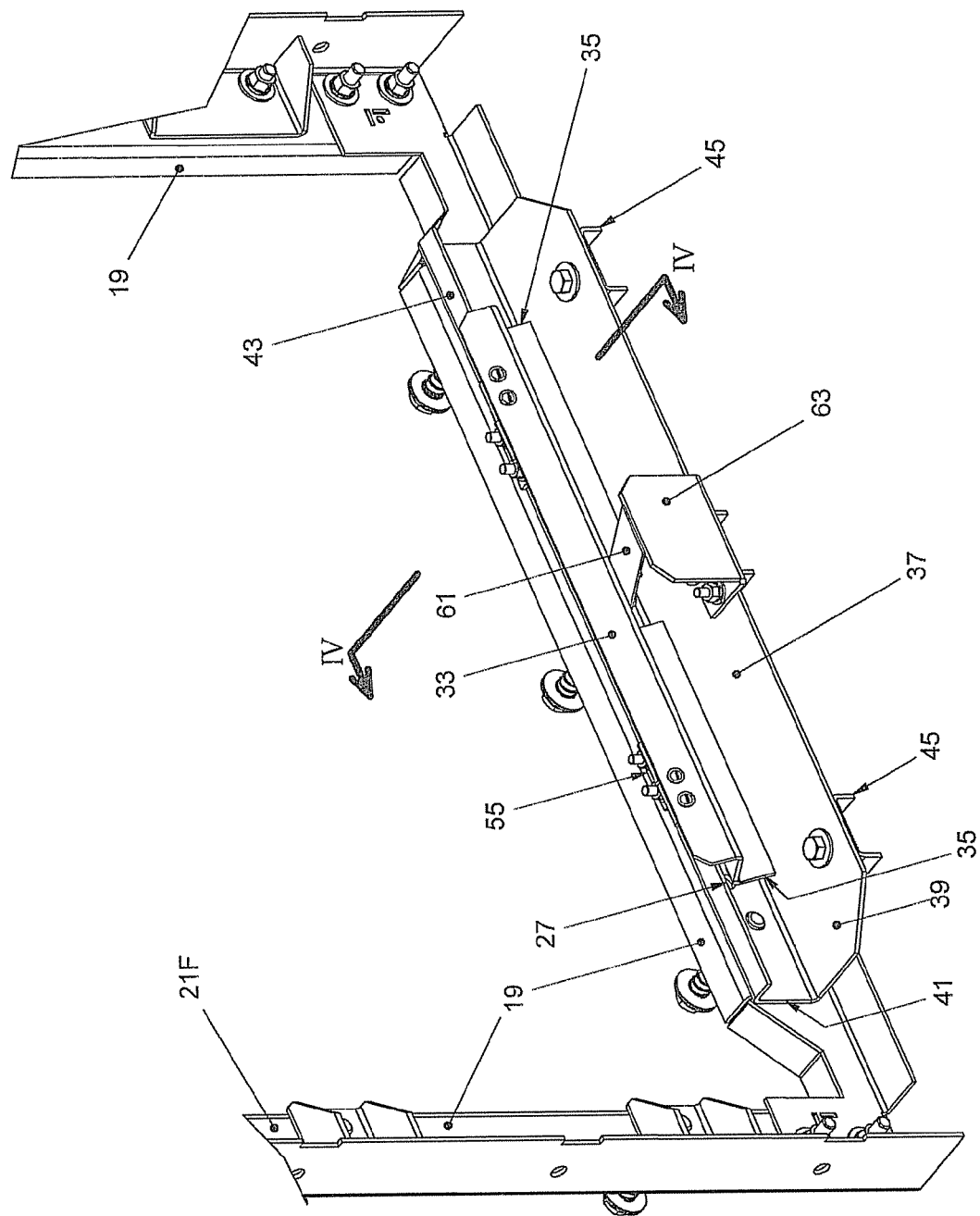
FIG. 3 is a perspective view from the inside of the compartment of FIG. 2, looking out through the door opening.

A vent flap 33 is located inside of the compartment 13 to selectively close the vent openings 27. Referring to FIG. 3, which is from the inside of the compartment looking toward the outside (the side and bottom walls of the enclosure and the gasket 29 are not shown), the vent flap 33 is located below the door opening 19.

The mounting arrangement of the vent flap will now be described referring to FIGS. 3 and 4. A mounting bracket 37 is provided, which bracket has a base 39, a riser 41 and a top portion 43. Feet 45, in the form of upside down "U" shaped channels, are coupled to the base 39. The feet 45 bear on the enclosure bottom wall 21B (see FIG. 4). The riser 41 extends up from the base and is mounted to a door footer 47. The door footer is substantially vertical when mounted to the enclosure and forms part of the front wall 21F, and particularly that part of the front wall that is below the door opening 19. The riser 41 and the door footer 47 have the vent openings 27. The top portion 43 of the mounting bracket extends away from the riser 41 and is parallel to the base 39.

The vent flap 33 is elongated between two ends 35 (see FIG. 3) so as to extend and cover all of the vent openings 27 when closed. When viewed as shown in FIG. 4, the vent flap 33 is shaped roughly like an angular "S", with end portions 49, 51 and a mid-portion 53. One of the end portions 51 is mounted to hinges 55. The hinges 55 are mounted to respective hinge plates 57 which are in turn mounted to the top portion 43 of the mounting bracket 37. The vent flap mid-portion 53 extends from the one end portion 51 toward the vent openings 27. The other end portion 49 of the vent flap extends down from the mid-portion. The hinges 55 allow the vent flap 33 to move between the open position (shown in FIG. 4), where there is a gap between the vent flap and the vent openings 27, and a closed position (shown in FIG. 5), where the vent flap other end portion 49 covers the vent openings 27. The vent flap other end portion 49 has a gasket 59 that provides a seal against the vent openings 27.

There is provided a latch arrangement for the vent flap 33. The latch arrangement holds or props the vent flap 33 in the open position. However, when the vent flap 33 has moved to the closed position, the latch arrangement holds the vent flap closed.

The latch arrangement includes a latch member 61 and a keeper 63.

The latch member 61 is a flexible sheet or leaf and can withstand the high temperatures of an arc fault explosion. In the preferred embodiment, the latch member 61 is made of a flexible material such a phosphorus bronze, fiberglass, etc. The particular material used depends on the location of the latch member relative to an anticipated arc-fault explosion. If too close, then fiberglass is used so as to survive the heat. One end of the latch member 61 is coupled to the vent flap 33 by way of bolts 66. The other end 67 is free. In the preferred embodiment, the latch member 61 is bolted to the mid-portion 53. The latch member 61 is located midway between the vent flap ends 35, as shown in FIG. 3.

The keeper 63 is mounted to the bottom portion 39 of the mounting bracket 37 and extends vertically up. In the preferred embodiment, the keeper 63 is a steel bracket shaped like an "L" as shown in the orientation of FIGS. 4 and 5. The upright portion extends parallel to the door footer 47 and has a free end 65 (or as shown in FIG. 4, a top edge). The upright portion also has a surface 69 that cooperates with the latch member 61. The free end 65 is horizontal. When the vent flap is closed as shown in FIG. 5, the surface 69 of the keeper is generally perpendicular to the unbent portion of the latch member 61. Unlike the flexible latch member 61, the keeper 63 is stiff.

The free end 67 of the latch member 61 bears on the free end 65 of the keeper 63, as shown in FIG. 4. In such an orientation, the vent flap 33 is in the open position, held so by the latch member bearing on the keeper. The free end 67 of the latch member has little or no overlap beyond the keeper free end 65. The latch member 61 may have a slight bow or curvature (as seen from the orientation of FIG. 4). When the vent flap is in the open position, air can pass through the vent openings 27. In normal operation, air is drawn into the compartment through the vent openings, heated by the components and rises to escape through the plenum. In the open position, the vent flap is located so that an arc fault explosion pushes the vent flap closed.

In the event of an arc fault explosion in the compartment, the blast, which occurs inside of the compartment (the left side of FIGS. 4 and 5), forces the vent flap 33 to the closed position, as shown in FIG. 5. The gasket 59 forms a seal about the vent openings 27, preventing the explosive gasses from exiting the enclosure. The latch member 61 and the keeper 63 remain intact during an arc fault explosion. The free end 67 of the latch member 61 is pulled off of the free end 65 of the keeper 63 as the vent flap closes. The free end of the latch member is pulled down the surface 69 of the keeper as shown in FIG. 5. The horizontal distance between the end 67 of latch member 61 and the coupling bolts 66 decreases as the vent flap closes, causing the latch member 61 to flex or bow. The flexing or bowing of the latch member 61 increases as the latch member 61 moves along the surface 69. Conversely, the keeper 63 does not bow or flex. This bowing in the latch member serves to secure the latch member in place and resist any movement of the latch member back up the keeper surface 69. This in turn resists movement of the vent flap away from the closed position. The free end 67 of the latch member 61 does not move back up the keeper surface 69. To reopen the vent flap, either the free end 67 would have to disengage from the keeper, or the bow of the latch member would have to be taken out. But the keeper 63 is strong and stiff and does not bend to release the latch member.

Without the latch 61, 63, the force of the vent flap 33 closing tends to create a bounce, wherein the vent flap opens and allows explosive gasses to escape. The latch 61, 63 prevents this reopening and maintains the vent flap in the closed position.

To enhance the latching properties of the latch member, the free end 67 of the latch member has squared 90° edges.

The surface 69 of the keeper 63 need not be treated or modified from the steel bracket component. Thus, the surface 69 can be smooth. As an alternative, the surface 69 could be made so as to increase its slip resistance. For example, the surface could be roughened by scoring it with horizontal grooves, or with pitting. As another example, the surface could be roughened by applying a grit to it, such as by a paint.

As shown in FIG. 5, the locations of the vent flap hinges 55, as well as the extension of the latch member 61 beyond the coupling bolts 66, are parameters in the latching properties. For the particular embodiment of FIGS. 4 and 5, the more pronounced the bow or flex of the latch member 61 in the closed position, the higher the latching capability, wherein the resistance to allow the vent flap to open is high. In addition, the surface area of the latch member 61 relative to the surface area of the flap is small and therefore, in the configurations shown in FIGS. 3-5, it does not interfere with the arc fault explosion acting to close the vent flap.

Figure 6:
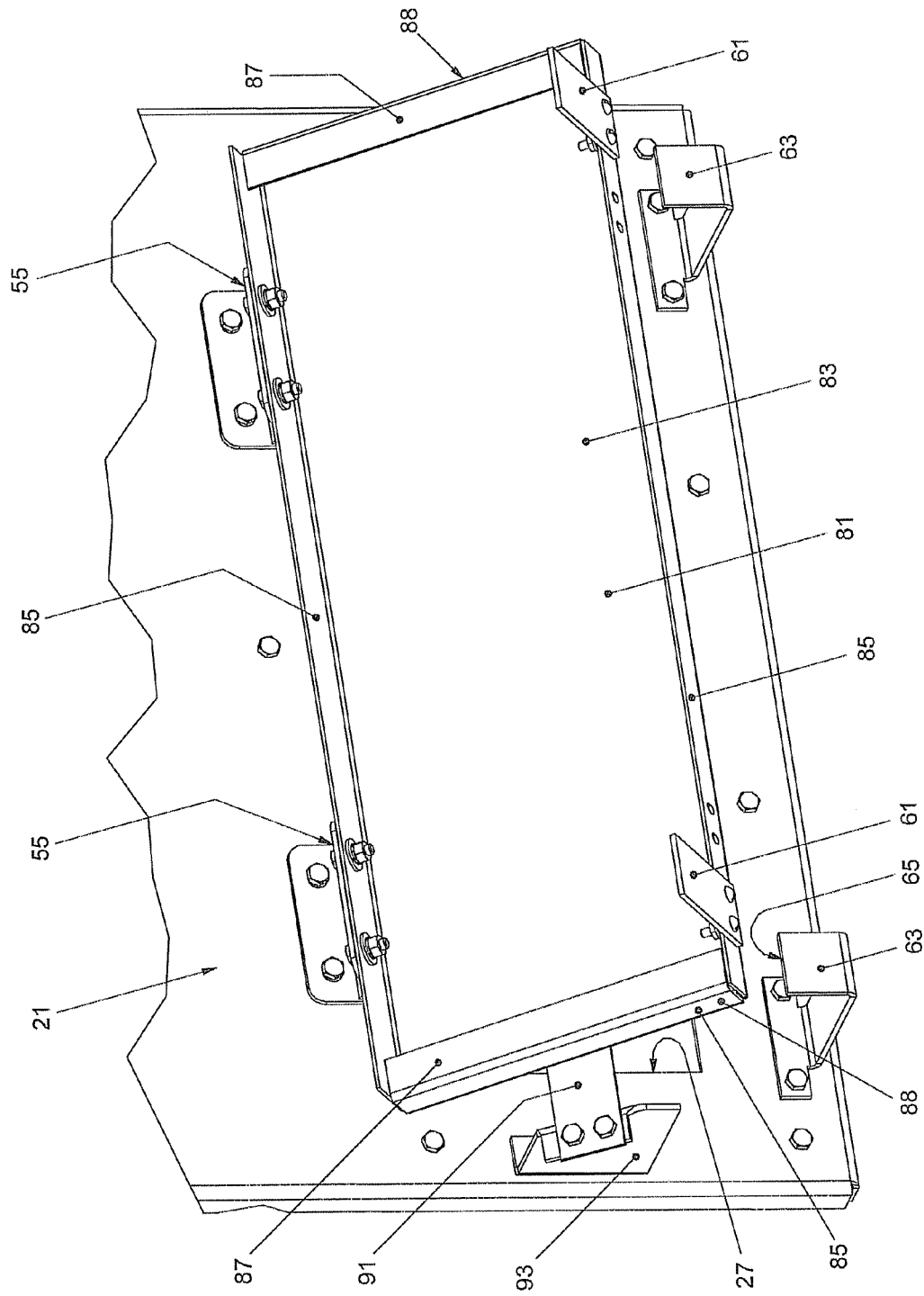
FIG. 6 is a perspective view of a vent flap, in accordance with another embodiment, shown in the open position.
Figure 7:
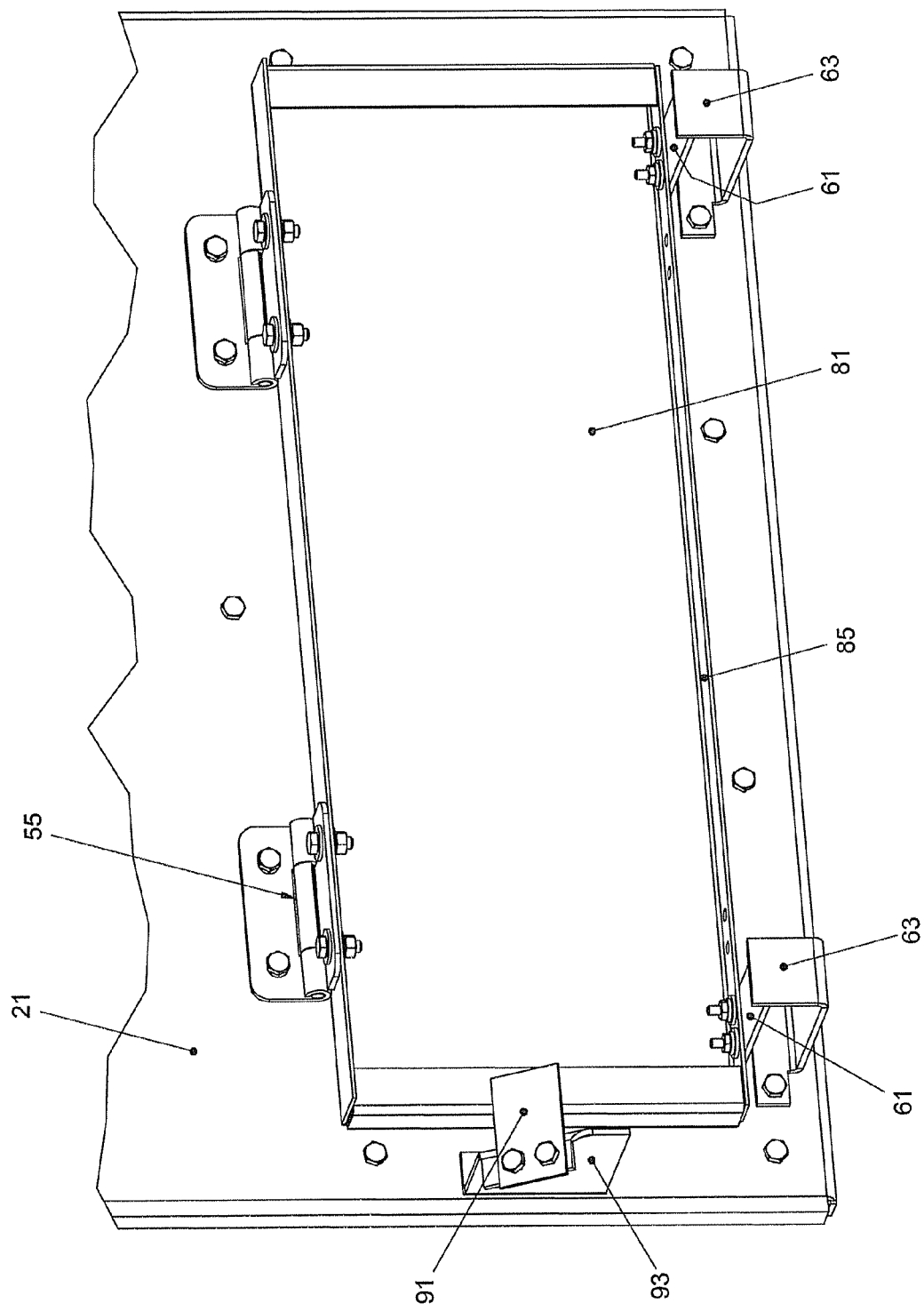
FIG. 7 shows the vent flap of FIG. 6 in the closed position.

FIGS. 6 and 7 show a vent flap 81 in accordance with another embodiment. The vent flap 81 is mounted to a wall 21 of an enclosure. The wall, which has one or more vent openings 27, could be a door or adjacent to a door, but need not be so. The vent flap 81 is mounted to wall by way of hinges 55. FIGS. 6 and 7 show the wall 21 in a vertical orientation, although the wall could be in a horizontal or some other orientation. A separate prop is used to keep the vent flap 81 open. In general, without a prop of some type, gravity would move the vent flap out of position; in this case, gravity would cause the vent flap to close against the vent openings 27.

The vent flap 81 is generally rectangular as shown in FIG. 6, having a main wall 83 and edge walls 85 that are perpendicular to the main wall. The hinges 55 are attached along one side to an edge wall. The vent flap 81 has two ends 87. At the ends 88, the edge walls 85 extend perpendicular to the main wall and then bend toward the opposite end where the edge walls 87 are parallel to the main wall. A gasket can be provided on the vent flap, or on the inside of the enclosure wall 21, to seal around the vent openings.

The area and location of the vent flap are factors to consider. A relatively large area vent flap (such as shown in FIGS. 6-9) is closed harder by an arc-fault explosion, because the larger surface area captures more of the explosion energy. Also, a vent flap located relatively close to an anticipated arc-fault explosion captures more energy. Consequently, more than one latch arrangement may be used to securely latch the vent flap closed.

In the open position, shown in FIG. 6, the vent flap 81 is at some angle relative to the wall (typically less than 90°) so as to be easily closed by arc fault explosion.

Latch arrangement 61, 63 latches the vent flap 81 closed after an arc fault explosion. In the embodiment shown in FIGS. 6 and 7, there are two latch arrangements, one near each end 88 of the vent flap 81.

Each latch member 61 is mounted to the bottommost edge wall 85 of the vent flap 81.

Each keeper 63 is a generally "L" shaped bracket having a top edge.

The vent flap 81 is kept in the open position by a prop 91. The prop 91 is a flexible leaf and is mounted to the enclosure wall 21 by a mounting bracket 93. The prop 91 has a free end that extends out to be positioned between the vent flap 81 and the enclosure wall 21 as shown in FIG. 6. Thus, the vent flap 81 bears on the prop. The prop can be made of the same flexible material as the latch member in FIGS. 4 and 5.

When an arc fault explosion occurs, the vent flap 81 is pushed closed (see FIG. 7). The latch member 61 is pulled along the top edge 65 of the keeper 63 (see also FIG. 4). When the vent flap 81 is closed, the free end of the latch member 61 falls from the top edge 65 of the keeper and contacts the surface 69.

In the embodiment shown in FIGS. 6 and 7, the latch member 61 is ⅛" thick fiberglass. Such fiberglass is stiffer than a metal latch member. The latch member of FIGS. 6 and 7 need not flex when the vent flap is closed. The gasket around the vent flap provides a slight amount of "give" or movement so that latch member closes.

Figure 8:
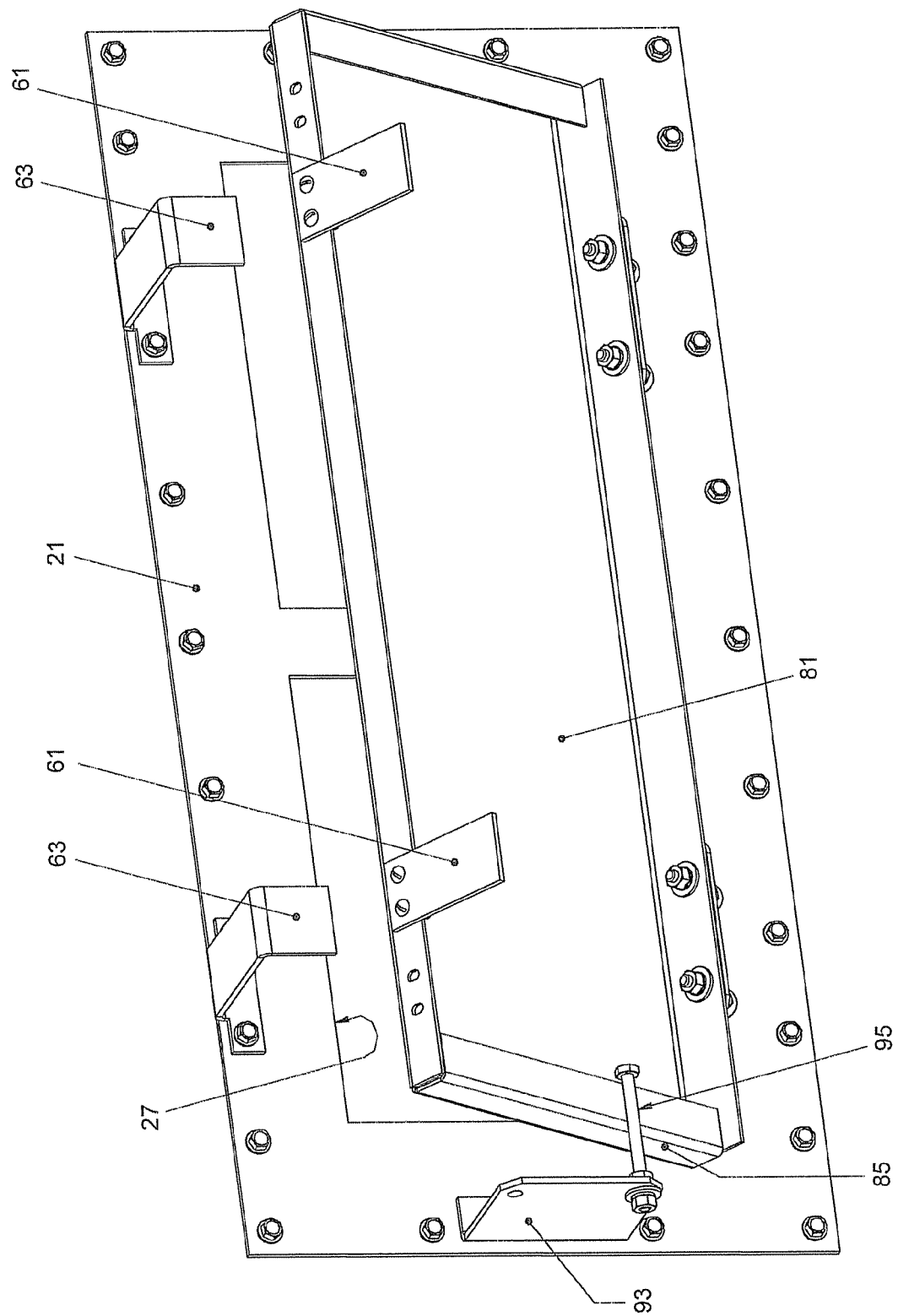
FIG. 8 is a perspective view of a vent flap, in accordance with another embodiment, shown in the open position.
Figure 9:
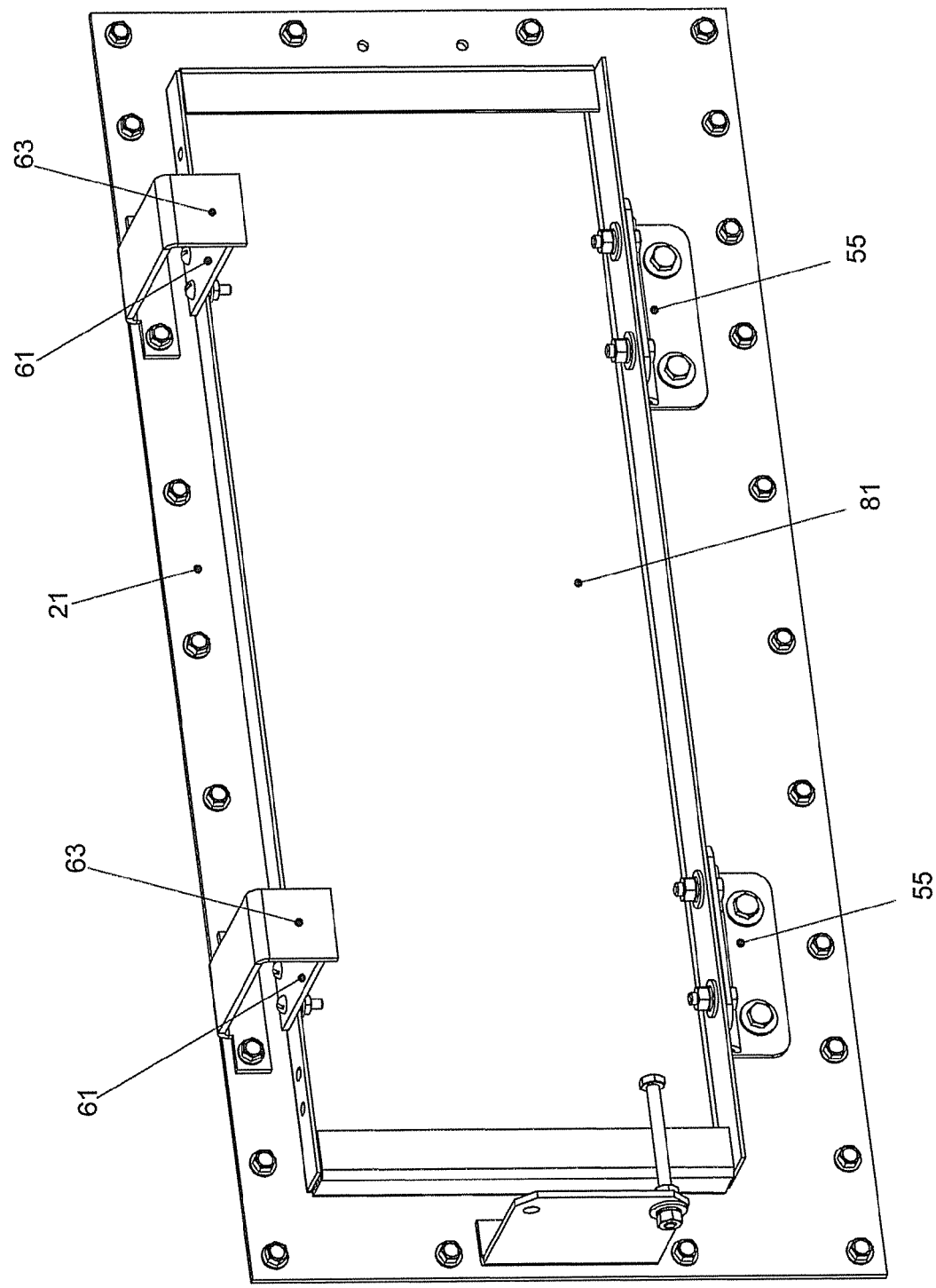
FIG. 9 shows the vent flap of FIG. 8 in the closed position.

In FIGS. 8 and 9, the vent flap 81 is hinged along the bottom edge. The latch arrangements 61, 63 serve to latch the vent flap 81. A separate prop 95 is used due to the orientation of the hinges 55 on the bottom of the vent flap 81. The prop 95 is a bolt or rod mounted to the enclosure wall 21 by a bracket 93. The enclosure wall is vertically oriented. The vent flap, when in the open position, is pulled by gravity away from the vent openings 27. Therefore, the prop 95 is used to keep the vent flap at an angle to the enclosure wall and in an open position.

The latch member or members 61 are coupled to the edge of the vent flap opposite the hinges 55. In the embodiment shown in FIG. 8, this is the top edge. The keepers 63 are appropriately positioned to engage the latch members when the vent flap is closed.

During an arc fault explosion, the vent flap 81 is pushed closed as shown in FIG. 9. As discussed above with respect to FIGS. 4-7, the latch members 61 contact the respective inclined edges 89 and the free ends 67 of the latch members then move along the surfaces 69 of the keepers, wherein the latch members become bowed. The latch arrangements 61, 63B prevent the vent flap from reopening.

Although the vent flap has been described in conjunction with inlet vents, the vent flap and latch arrangement could be used with outlet vents.

Although the latch member has been described as mounted to the vent flap and the keeper mounted to the enclosure, this need not be the case as the latch member could be mounted to the enclosure and the keeper mounted to the vent flap. The keeper could be integrated into the vent flap itself. For example, the keeper could be a rolled over end wall similar to end wall 87 in FIG. 6.

Arc-fault explosions occur very quickly. The latch arrangement is fast-responding in allowing the vent flap to close and keeping the vent flap closed.

The foregoing disclosure and showings made in the drawings are merely illustrative of the principles of this invention and are not to be interpreted in a limiting sense.

The invention claimed is:
1. An arc-resistant switchgear enclosure, comprising:
a) a wall defining an interior compartment;
b) the wall having a vent that communicates with the compartment;

c) a vent flap movable between open and closed positions, with the closed position being where the vent flap closes the vent, with the open position being where the vent is open;

d) a latching arrangement comprising a latch member and a keeper, the latch member mounted to one of the enclosure wall or the vent flap, with the keeper mounted to the other of the enclosure wall or the vent flap, the latch member being more flexible than the keeper, the latch member having a free end and the keeper having a surface, the latch member free end engaging the keeper surface when the vent flap is in the closed position, thereby preventing the vent flap from opening.

2. The arc-resistant switchgear enclosure of claim 1 wherein the latch member comprises a leaf.

3. The arc-resistant switchgear enclosure of claim 2 wherein the latch member is flexed when the vent flap is in the closed position and the latch member free end engages the keeper.

4. The arc-resistant switchgear enclosure of claim 1 wherein the keeper is "L" shaped.

5. The arc-resistant switchgear enclosure of claim 1 wherein the latch member bears on the keeper when the vent flap is in the open position so as to prop open the vent flap.

6. The arc-resistant switchgear enclosure of claim 1 wherein:
   a) the latch member comprises a leaf;
   b) the latch member is flexed when the vent flap is in the closed position and the latch member free end engages the keeper;
   c) the keeper is "L" shaped;
   d) the latch member bears on the keeper when the vent flap is in the open position so as to prop open the vent flap.

7. The arc-resistant switchgear enclosure of claim 1 wherein the vent flap is mounted to the enclosure wall by at least one hinge along a side of the vent flap, the latch member located on an opposite side of the vent flap.

8. The arc-resistant switchgear enclosure of claim 1 wherein the latch member is a first latch member and the keeper is a first keeper, further comprising a second latch member and a second keeper to the second latch member mounted to the other end of the vent flap.

9. The arc-resistant switchgear enclosure of claim 1 wherein the vent flap is shaped like an angular "S" in transverse cross-section, the vent flap having a first end portion mounted to the enclosure wall by hinges, the vent flap having a mid-portion connected to the first end portion and a second end portion connected to the mid-portion.

10. The arc-resistant switchgear enclosure of claim 1 further comprising a prop for supporting the vent flap in the open position.

11. A method of closing a vent in a switchgear enclosure during an arc fault explosion inside of the enclosure, comprising the steps of:
   a) providing a vent flap in an open position relative to the vent to allow air to pass through the vent;
   b) propping the vent flap in the open position;
   c) allowing the arc fault explosion to move the vent flap to close the vent;
   d) as the vent closes, moving a latch member along a surface of a keeper, the latch member becoming bowed;
   e) after the vent flap closes, preventing the reopening of the vent flap by the latch member acting on the keeper.

12. The method of claim 11 wherein the step of moving a latch member along a surface of a keeper further comprises the step of sliding a free end of the latch member along the keeper surface.

13. The method of claim 11 wherein the step of propping the vent flap in the open position further comprises the step of contacting the latch member on the keeper.

* * * * *